US012619541B2

(12) United States Patent     (10) Patent No.:   US 12,619,541 B2

Sankaranarayanan et al.     (45) Date of Patent:     May 5, 2026

(54) CONCURRENT PAGE CACHE RESOURCE ACCESS IN A MULTI-PLANE MEMORY DEVICE

(71) Applicant: Micron Technology, Inc., Boise, ID (US)

(72) Inventors: Sundararajan Sankaranarayanan, Fremont, CA (US); Eric N. Lee, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/671,846

(22) Filed: May 22, 2024

(65) Prior Publication Data

US 2024/0311307 A1     Sep. 19, 2024

Related U.S. Application Data

(63) Continuation of application No. 17/547,818, filed on Dec. 10, 2021, now Pat. No. 12,019,550.

(Continued)

(51) Int. Cl.
    *G06F 12/084*     (2016.01)
    *G06F 3/06*     (2006.01)
    (Continued)

(52) U.S. Cl.
    CPC .......... *G06F 12/084* (2013.01); *G06F 3/0611* (2013.01); *G06F 3/0656* (2013.01); *G06F 3/0679* (2013.01); *G06F 12/0882* (2013.01); *G11C 16/24* (2013.01); *G11C 16/26* (2013.01); *G06F 2212/1024* (2013.01); *G06F 2212/222* (2013.01); *G11C 16/0483* (2013.01)

(58) Field of Classification Search
None
See application file for complete search history.

(56) References Cited

U.S. PATENT DOCUMENTS 5,103,425 A   *   4/1992   Kuo ........................ G11C 16/08
                                      365/185.11
7,750,915 B1     7/2010   Acocella et al.
                 (Continued)

FOREIGN PATENT DOCUMENTS

CN     108694135 A     10/2018
CN     110503990 A     11/2019

OTHER PUBLICATIONS

Microsoft, "Computer Dictionary", Fifth Edition, Microsoft Press, 2002, p. 445 (Year: 2002).*
Anonymous, "Difference Between FDM and TDM: Basic Points," Feb. 10, 2021, 9 Pages, Retrieved from the Internet: URL:https://web.archive.org/web/ 20210210073111/https://www.linquip.com/blog/difference-between-fdm-and-tdm/.
Anonymous, "Time Division Multiplexing (TDM)," Oct. 13, 2014, 7 Pages, Retrieved from the Internet: URL: https://www.techopedia.com/definition/9669/ time-division-multiplexing-tdm.

(Continued)

*Primary Examiner* — Christopher D Birkhimer
(74) *Attorney, Agent, or Firm* — Lowenstein Sandler LLP

(57)          ABSTRACT

A memory device includes a first memory array, a second memory array, and a page cache circuit coupled to the first memory array and the second memory array. The page cache circuit includes at least one set of concurrent resources and at least one shared resource, wherein the at least one set of concurrent resources are asynchronously and concurrently accessible by the first memory array and the second memory array, and wherein the at least one shared resource is accessible in a time-multiplexed fashion by the first memory array and the second memory array.

20 Claims, 11 Drawing Sheets

Related U.S. Application Data

(60) Provisional application No. 63/202,287, filed on Jun. 4, 2021.

(51) Int. Cl.

| | |
|---|---|
| *G06F 12/0882* | (2016.01) |
| *G11C 16/04* | (2006.01) |
| *G11C 16/24* | (2006.01) |
| *G11C 16/26* | (2006.01) |

(56) References Cited

U.S. PATENT DOCUMENTS

| | | | | |
|---|---|---|---|---|
| 9,627,011 | B1 * | 4/2017 | Conte | ................. H03F 3/45475 |
| 2003/0233525 | A1 | 12/2003 | Reeves | |
| 2005/0114856 | A1 | 5/2005 | Eickemeyer et al. | |
| 2011/0063888 | A1 * | 3/2011 | Chi | .................... G11C 13/0069 |
| | | | | 257/408 |
| 2017/0315737 | A1 | 11/2017 | Kajigaya | |
| 2018/0261292 | A1 | 9/2018 | Helm et al. | |
| 2019/0228812 | A1 * | 7/2019 | Mathews | ............ G11C 11/4091 |

| | | | | |
|---|---|---|---|---|
| 2020/0343867 | A1 | 10/2020 | Agarwal et al. | |

OTHER PUBLICATIONS

Lemmon M., "What is Time Multiplexing," 2009, 1 Pages, Retrieved from the Internet: URL:https://www3.nd.edu/-lemmon/courses/ee224/ web-manual/web-manual/lab10/node4.html.

Merriam-Webster., "Asynchronous," Jul. 1, 2020, 4 Pages, Retrieved from the Internet: URL:https://web.archive.Org/web/20200701035438/https://www.merriam-webster.com/dictionary/asynchronous.

Merriam-Webster., "concurrent," Jul. 23, 2020, 6 Pages, Retrieved from the Internet: URL:https://web.archive.Org/web/20200723005511/https://www.merriam-webster.com/dictionary/concurrent.

Zhang P., "Data Transmission Interfaces," Advanced Industrial Control Technology, Chapter 14, 2010, pp. 557-598.

Haitao, Y & Tao, S., "Based on FPGA: Design of High-speed and Large-capacity Solid-state Storage Devices," Foreign Electronic Components, May 2007, Issue: 5, pp. 68-72.

Office Action for Chinese Patent Application No. 202210634873.2, mailed Jul. 30, 2025, 31 Pages.

* cited by examiner

1000

RECEIVE REQUESTS TO PERFORM MEMORY ACCESS OPERATIONS ON FIRST AND SECOND MEMORY ARRAYS  1005

PERFORM FIRST PORTION OF FIRST MEMORY ACCESS OPERATION AND FIRST PORTION OF SECOND MEMORY ACCESS OPERATION USING CONCURRENT RESOURCES OF PAGE CACHE CIRCUIT 1010

SELECT SECOND PORTION OF FIRST MEMORY ACCESS OPERATION TO PERFORM USING AN ARBITRATION SCHEME 1015

PERFORM SECOND PORTION OF FIRST MEMORY ACCESS OPERATION USING SHARED RESOURCE OF PAGE CACHE CIRCUIT 1020

PERFORM SECOND PORTION OF SECOND MEMORY ACCESS OPERATION USING SHARED RESOURCE OF PAGE CACHE CIRCUIT  1025

FIG. 10

CONCURRENT PAGE CACHE RESOURCE ACCESS IN A MULTI-PLANE MEMORY DEVICE

RELATED APPLICATION

This application is a continuation application of co-pending U.S. patent application Ser. No. 17/547,818, filed Dec. 10, 2021, which claims the benefit of U.S. Provisional Patent Application Ser. No. 63/202,287, filed Jun. 4, 2021, each of which is incorporated herein by reference.

TECHNICAL FIELD

Embodiments of the disclosure relate generally to memory sub-systems, and more specifically, relate to concurrent page cache resource access in a multi-plane memory device in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 10 is a flow diagram of an example method of providing concurrent page cache resource access in a multi-plane memory device in accordance with some embodiments of the present disclosure.

DETAILED DESCRIPTION

Figure 1:
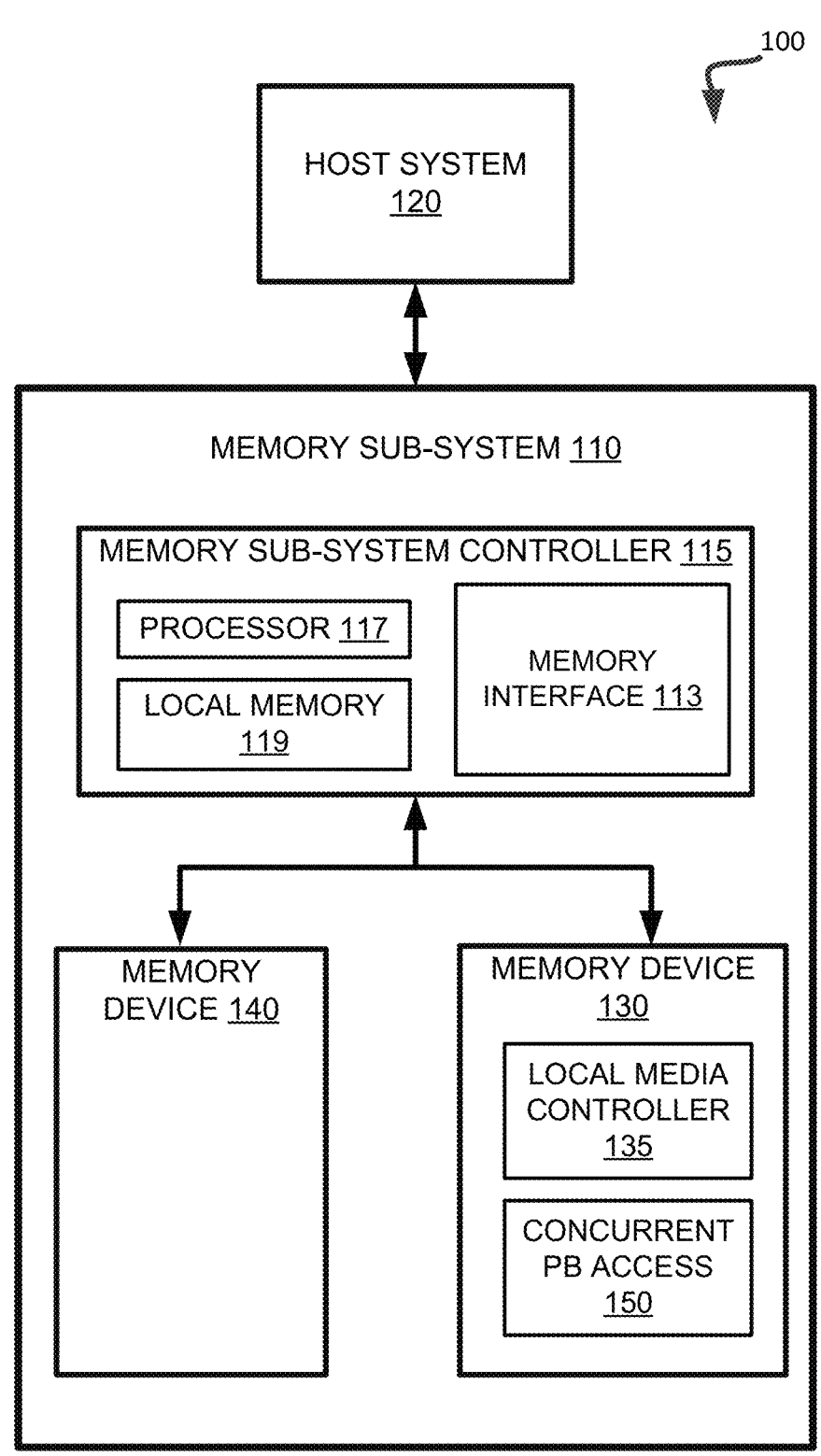
FIG. 1 illustrates an example computing system that includes a memory sub-system in accordance with some embodiments of the present disclosure.

Aspects of the present disclosure are directed to concurrent page cache resource access in a multi-plane memory device in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or a three-dimensional grid. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include multiple access line driver circuits and power circuits that can be shared by the planes of the memory device to facilitate concurrent access of pages of two or more memory planes, including different page types. For ease of description, these circuits can be generally referred to as independent plane driver circuits.

In certain multi-plane memory devices, there is generally a one to one correspondence between a memory array associated with each plane and other related circuitry, such as for example, an independent plane driver circuit, a wordline path, and a bitline path including a page cache (e.g., a page buffer) with bitline bias circuitry, a sense amplifier, and a number of registers. The independent plane driver circuits allow for parallel and concurrent memory access operations to be performed on the respective memory arrays of each plane of the multi-plane memory device. With the one to one correspondence, however, such as where each plane includes a separate page cache, significant area is consumed by the separate page caches and associated bitline path circuitry. In general, each page cache can include multiple registers, such as a cache register and one or more data registers in order to support various memory example operations. For example, multiple registers are utilized temporarily store data when multi-bit program operations (e.g., triple level cell (TLC) or quad-level cell (QLC) program operations) are being performed. For single bit program operations (e.g., single-level cell (SLC) program operations) or any read operations, however, only a single register is used. Thus, for many operations, certain portions of the page caches are unused and are replicated for each plane unnecessarily, when such portions could be shared by two or more planes of the multi-plane memory device.

Aspects of the present disclosure address the above and other deficiencies by providing concurrent page cache resource access in a multi-plane memory device in a memory sub-system. In one embodiment, a memory device includes multiple memory arrays (e.g., a first memory array and a second memory array) and a common page cache circuit that is shared by the multiple memory arrays. The page cache circuit includes a number of resources, and depending on the embodiment, can include at least one set of concurrent resources and at least one shared resource. The set of concurrent resources are asynchronously and concurrently accessible by the multiple memory arrays, while the at least one shared resource is accessible in a time-multiplexed fashion by the multiple memory arrays. The design of the page cache circuit is flexible, such that more or fewer resources can be designed as concurrent resources or shared resources. Depending on which resources in the page cache circuit are concurrent resources (i.e., there duplicate instances of a given resource corresponding to each of the multiple memory arrays) and which are shared resources (i.e., there is a single instance of a given resource which is shared by the multiple memory arrays), certain operations, or portions of operations, can be performed concurrently (i.e., at least partially overlapping in time) on the multiple memory arrays.

Advantages of this approach include, but are not limited to, improved performance in the memory sub-system. Sharing resources of a single page cache circuit among multiple memory arrays in the memory device decreases the number of page cache circuits in the memory device, which similarly decreases the size, cost, and complexity of the memory device. Even while providing these savings, the approach described herein can provide increased multi-plane read parallelism, increased multi-plane program parallelism for SLC program operations, asynchronous page access in the multiple memory arrays, and general latency improvements attributable to the reduced bitline line length in the multiple memory arrays.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface, Open NAND Flash Interface (ONFI) interface, or some other interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

In one embodiment, the memory sub-system 110 includes a memory interface component 113. Memory interface component 113 is responsible for handling interactions of memory sub-system controller 115 with the memory devices of memory sub-system 110, such as memory device 130. For example, memory interface component 113 can send memory access commands corresponding to requests received from host system 120 to memory device 130, such as program commands, read commands, or other commands.

In addition, memory interface component 113 can receive data from memory device 130, such as data retrieved in response to a read command or a confirmation that a program command was successfully performed. In some embodiments, the memory sub-system controller 115 includes at least a portion of the memory interface 113. For example, the memory sub-system controller 115 can include a processor 117 (e.g., a processing device) configured to execute instructions stored in local memory 119 for performing the operations described herein. In some embodiments, the memory interface component 113 is part of the host system 110, an application, or an operating system.

In one embodiment, memory device 130 includes concurrent page buffer (PB) resources access circuitry 150. In one embodiment, circuitry 150 provides concurrent page buffer (i.e., page cache) resource access to multiple planes of memory device 130. In one embodiment, each plane includes a separate memory array. Circuitry 150 can include a common page cache circuit that is shared by the separate memory arrays. The page cache circuit includes a number of resources, and depending on the embodiment, can include at least one set of concurrent resources and at least one shared resource. The set of concurrent resources are asynchronously and concurrently accessible by the multiple memory arrays, while the at least one shared resource is accessible in a time-multiplexed fashion by the multiple memory arrays. The design of the page cache circuit is flexible, such that more or fewer resources can be designed as concurrent resources or shared resources. Depending on which resources in the page cache circuit are concurrent resources (i.e., there duplicate instances of a given resource corresponding to each of the multiple memory arrays) and which are shared resources (i.e., there is a single instance of a given resource which is shared by the multiple memory arrays), certain operations, or portions of operations, can be performed concurrently (i.e., at least partially overlapping in time) on the multiple memory arrays. Depending on the embodiment, there can be a single page cache circuit that is shared by two or more memory arrays (e.g., 2 memory arrays, 4 memory arrays, 8 memory arrays, etc.). In another embodiment, there can be a set of multiple page cache circuits that are shared by multiple memory arrays in a fully configurable manner. The number of memory arrays can be equal to or greater than the number of page cache circuits. For example, in one embodiment, there could be two page cache circuits which are shared by a set of four memory arrays, such that any of the memory arrays can access and utilize the resources of either of the page cache circuits according to an associated arbitration scheme. Other implementations are possible. Further details with regards to the operations of concurrent page buffer (PB) resources access circuitry 150 are described below.

Figure 2:
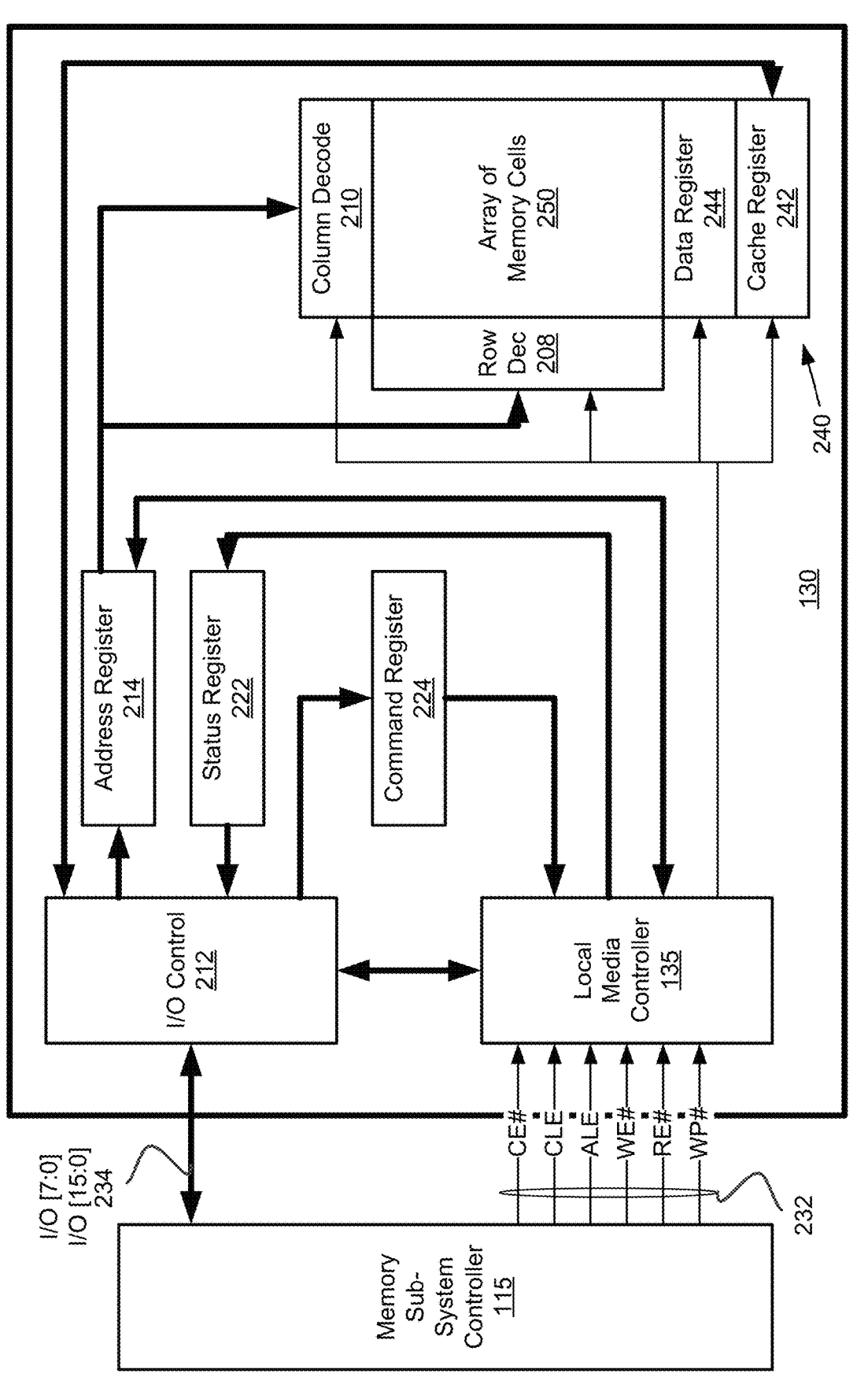
FIG. 2 is a block diagram of a memory device in communication with a memory sub-system controller of a memory sub-system, according to an embodiment.

FIG. 2 is a simplified block diagram of a first apparatus, in the form of a memory device 130, in communication with a second apparatus, in the form of a memory sub-system controller 115 of a memory sub-system (e.g., memory sub-system 110 of FIG. 1), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 250 logically arranged in rows and columns. Memory cells of a logical row are typically connected to the same access line (e.g., a word line) while memory cells of a logical column are typically selectively connected to the same data line (e.g., a bit line). A single access line may be associated with more than one logical row of memory cells and a single data line may be associated with more than one logical column. Memory cells (not shown in FIG. 2) of at least a portion of array of memory cells 250 are capable of being programmed to one of at least two target data states.

Row decode circuitry 208 and column decode circuitry 210 are provided to decode address signals. Address signals are received and decoded to access the array of memory cells 250. Memory device 130 also includes input/output (I/O) control circuitry 212 to manage input of commands, addresses and data to the memory device 130 as well as output of data and status information from the memory device 130. An address register 214 is in communication with I/O control circuitry 212 and row decode circuitry 208 and column decode circuitry 210 to latch the address signals prior to decoding. A command register 224 is in communication with I/O control circuitry 212 and local media controller 135 to latch incoming commands.

A controller (e.g., the local media controller 135 internal to the memory device 130) controls access to the array of memory cells 250 in response to the commands and generates status information for the external memory sub-system controller 115, i.e., the local media controller 135 is configured to perform access operations (e.g., read operations, programming operations and/or erase operations) on the array of memory cells 250. The local media controller 135 is in communication with row decode circuitry 208 and column decode circuitry 210 to control the row decode circuitry 208 and column decode circuitry 210 in response to the addresses.

The local media controller 135 is also in communication with a page cache 240 including cache register 242 and data register 244. Cache register 242 latches data, either incoming or outgoing, as directed by the local media controller 135 to temporarily store data while the array of memory cells 250 is busy writing or reading, respectively, other data. During a program operation (e.g., write operation), data may be passed from the cache register 242 to the data register 244 for transfer to the array of memory cells 250; then new data may be latched in the cache register 242 from the I/O control circuitry 212. During a read operation, data may be passed from the cache register 242 to the I/O control circuitry 212 for output to the memory sub-system controller 115; then new data may be passed from the data register 244 to the cache register 242. The cache register 242 and/or the data register 244 may form (e.g., may form a portion of) page cache 240 of the memory device 130. Page cache 240 may further include sensing devices (not shown in FIG. 2) to sense a data state of a memory cell of the array of memory cells 250, e.g., by sensing a state of a data line connected to that memory cell. A status register 222 may be in communication with I/O control circuitry 212 and the local memory controller 135 to latch the status information for output to the memory sub-system controller 115. In one embodiment, at least a portion of the resources of page cache 240 is shared among two or more planes, or two or more portions of a single plane, within memory device 130.

Memory device 130 receives control signals at the memory sub-system controller 115 from the local media controller 135 over a control link 232. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 232 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 234 and outputs data to the memory sub-system controller 115 over I/O bus 234.

For example, the commands may be received over input/output (I/O) pins [7:0] of I/O bus 234 at I/O control circuitry 212 and may then be written into command register 224. The addresses may be received over input/output (I/O) pins [7:0] of I/O bus 234 at I/O control circuitry 212 and may then be written into address register 214. The data may be received over input/output (I/O) pins [7:0] for an 8-bit device or input/output (I/O) pins [15:0] for a 16-bit device at I/O control circuitry 212 and then may be written into cache register 242. The data may be subsequently written into data register 244 for programming the array of memory cells 250.

In an embodiment, cache register 242 may be omitted, and the data may be written directly into data register 244. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 2 has been simplified. It should be recognized that the functionality of the various block components described with reference to FIG. 2 may not necessarily be segregated to distinct components or component portions of an integrated circuit device. For example, a single component or component portion of an integrated circuit device could be adapted to perform the functionality of more than one block component of FIG. 2. Alternatively, one or more components or component portions of an integrated circuit device could be combined to perform the functionality of a single block component of FIG. 2. Additionally, while specific I/O pins are described in accordance with popular conventions for receipt and output of the various signals, it is noted that other combinations or numbers of I/O pins (or other I/O node structures) may be used in the various embodiments.

Figure 3:
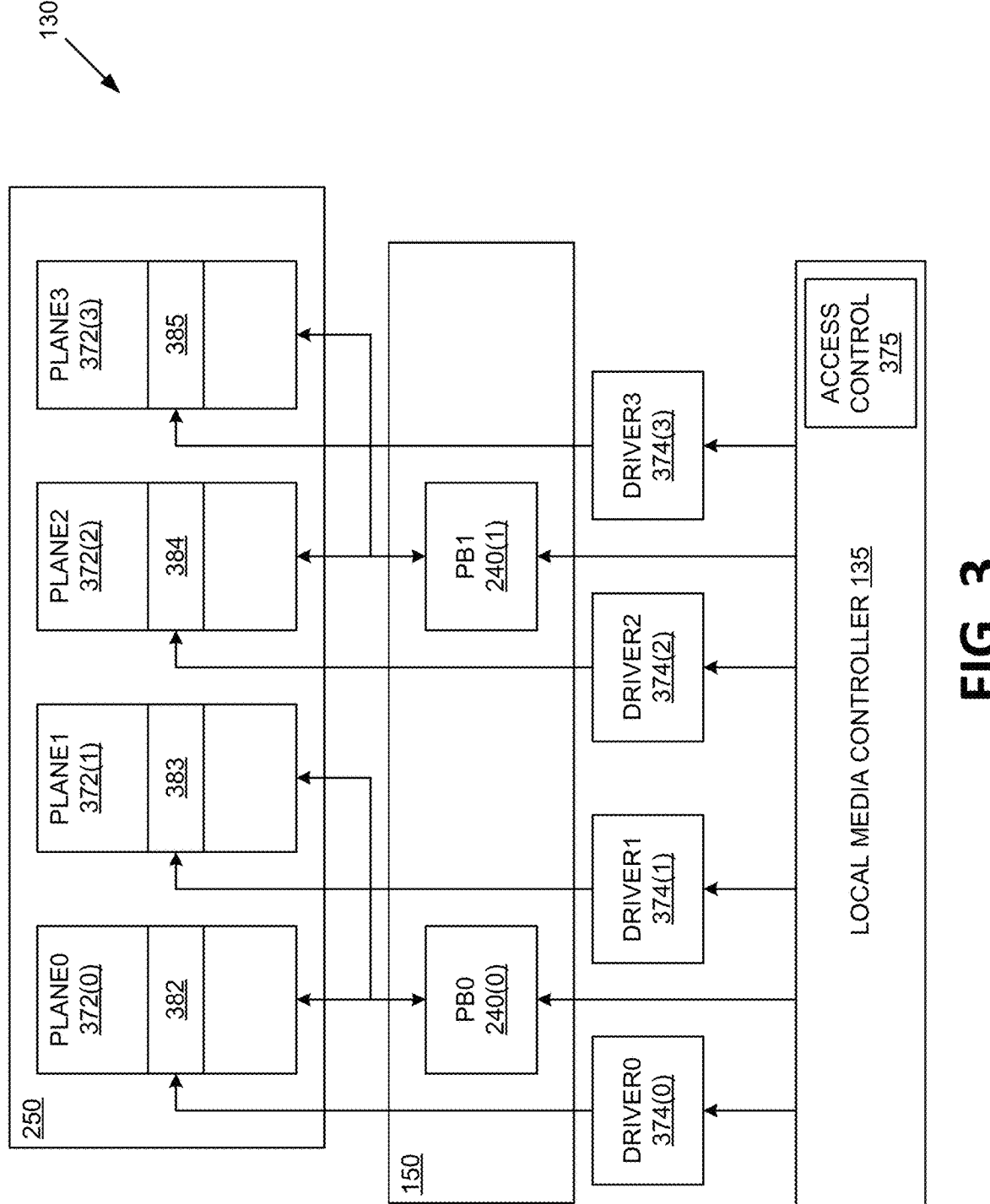
FIG. 3 is a block diagram illustrating a multi-plane memory device configured for concurrent page cache resource access in accordance with some embodiments of the present disclosure.

FIG. 3 is a block diagram illustrating a multi-plane memory device 130 configured for concurrent page cache resource access in accordance with some embodiments of the present disclosure. The memory planes 372(0)-372(3) can each be divided into blocks of data, with a different relative block of data from two or more of the memory planes 372(0)-372(3) concurrently accessible during memory access operations. For example, during memory access operations, two or more of data block 382 of the memory plane 372(0), data block 383 of the memory plane 372(1), data block 384 of the memory plane 372(2), and data block 385 of the memory plane 372(3) can each be accessed concurrently.

The memory device 130 includes a memory array 250 divided into memory planes 372(0)-372(3) that each includes a respective number of memory cells. The multi-plane memory device 130 can further include local media controller 135 coupled to memory array 250. The memory cells can be non-volatile memory cells, such as NAND flash cells, or can generally be any type of memory cells. In one embodiment, each of memory planes 372(0)-372(3) includes a respective memory array of memory cells. In one embodiment, each of memory planes 372(0)-372(3) can include two or more independent memory arrays of memory cells.

In one embodiment multiple subsets of the memory planes 372(0)-372(3) can each be coupled to a respective page cache 240(0)-240(1). For example, memory planes 372(0)-372(3) can be coupled to page cache 240(0) and memory planes 372(0)-372(1) can be coupled to page cache 240(1). Thus, the resources of page caches 240(0)-240(1) can be concurrently accessed by multiple memory planes 372(0)-372(3). Each page cache 240(0)-240(1) can be configured to provide data to or receive data from the respective set of memory plane 372(0)-372(3). The page caches 240(0)-240(1) can be controlled by local media controller 135 and either together or individually, page caches 240(0)-240(1) can form concurrent page buffer (PB) resources access circuitry 150. Data received from the respective memory plane 372(0)-372(3) can be latched at the page caches 240(0)-240(1), respectively on a time-multiplexed basis, and retrieved by local media controller 135, and provided to the memory sub-system controller 115 via an ONFI interface, for example.

Each of the memory planes 372(0)-372(3) can be further coupled to a respective access driver circuit 374(0)-374(3), such as an access line driver circuit. The driver circuits 374(0)-374(3) can be configured to condition a page of a respective block of an associated memory plane 372(0)-372(3) for a memory access operation, such as programming data (i.e., writing data), reading data, or erasing data. Each of the driver circuits 374(0)-374(3) can be coupled to a respective global access lines associated with a respective memory plane 372(0)-372(3). Each of the global access lines can be selectively coupled to respective local access lines within a block of a plane during a memory access operation associated with a page within the block. The driver circuits 374(0)-374(3) can be controlled based on signals from local media controller 135. Each of the driver circuits 374(0)-374(3) can include or be coupled to a respective power circuit, and can provide voltages to respective access lines based on voltages provided by the respective power circuit. The voltages provided by the power circuits can be based on signals received from local media controller 135.

The local media controller 135 can control the driver circuits 374(0)-374(3) and page caches 240(0)-240(1) to concurrently perform memory access operations associated with each of a group of memory command and address pairs (e.g., received from memory sub-system controller 115). For example, local media controller 135 can control the driver circuits 374(0)-374(3) and page caches 240(0)-240(1) to perform the concurrent memory access operations. Local media controller 135 can include a power control circuit that serially configures two or more of the driver circuits 374(0)-374(3) for the concurrent memory access operations, and an access control circuit 375 configured to control two or more of the buffers 240(0)-240(1) to sense and latch data from the respective memory planes 372(0)-372(3), or program data to the respective memory planes 372(0)-372(3) to perform the concurrent memory access operations.

In operation, local media controller 135 can receive a group of memory command and address pairs via the ONFI bus, with each pair arriving in parallel or serially. In some examples, the group of memory command and address pairs can each be associated with different respective memory planes 372(0)-372(3) of the memory array 250. The local media controller 135 can be configured to perform concurrent memory access operations (e.g., read operations or program operations) for the different memory planes 372 (0)-372(3) of the memory array 250 responsive to the group of memory command and address pairs. For example, the power control circuit of local media controller 135 can serially configure, for the concurrent memory access operations based on respective page type (e.g., UP, MP, LP, XP, SLC/MLC/TLC/QLC page), the driver circuits 374(0)-374 (3) for two or more memory planes 372(0)-372(3) associated with the group of memory command and address pairs. After the access line driver circuits 374(0)-374(3) have been configured, the access control circuit of local media controller 135 can concurrently control the page caches 240(0)-240(1) to access the respective pages of each of the two or more memory planes 372(0)-372(3) associated with the group of memory command and address pairs, such as retrieving data or writing data, during the concurrent memory access operations. For example, the access control circuit can concurrently (e.g., in parallel and/or contemporaneously) control the page caches 240(0)-240(1) to charge/discharge bitlines, sense data from the two or more memory planes 372(0)-372(3), and/or latch the data.

Based on the signals received from local media controller 135, the driver circuits 374(0)-374(3) that are coupled to the memory planes 372(0)-372(3) associated with the group of memory command and address command pairs can select blocks of memory or memory cells from the associated memory plane 372(0)-372(3), for memory operations, such as read, program, and/or erase operations. The driver circuits 374(0)-374(3) can drive different respective global access lines associated with a respective memory plane 372(0)-372 (3). As an example, the driver circuit 374(0) can drive a first voltage on a first global access line associated with the memory plane 372(0), the driver circuit 374(1) can drive a second voltage on a third global access line associated with the memory plane 372(1), the driver circuit 374(2) can drive a third voltage on a seventh global access line associated with the memory plane 372(2), etc., and other voltages can be driven on each of the remaining global access lines. In some examples, pass voltages can be provided on all access lines except an access line associated with a page of a memory plane 372(0)-372(3) to be accessed. The local media controller 135, the driver circuits 374(0)-374(3) can allow different respective pages, and the page caches 240 (0)-240(1) within different respective blocks of memory cells, to be accessed concurrently. For example, a first page of a first block of a first memory plane can be accessed concurrently with a second page of a second block of a second memory plane, regardless of page type.

The page caches 240(0)-240(1) can provide data to or receive data from the local media controller 135 during the memory access operations responsive to signals from the local media controller 135 and the respective memory planes 372(0)-372(3). The local media controller 135 can provide the received data to memory sub-system controller 115.

It will be appreciated that the memory device 130 can include more or less than four memory planes, driver circuits, and page caches. It will also be appreciated that the respective global access lines can include 8, 16, 32, 64, 128, etc., global access lines. The local media controller 135 and the driver circuits 374(0)-374(3) can concurrently access different respective pages within different respective blocks of different memory planes when the different respective pages are of a different page type.

Figure 4:
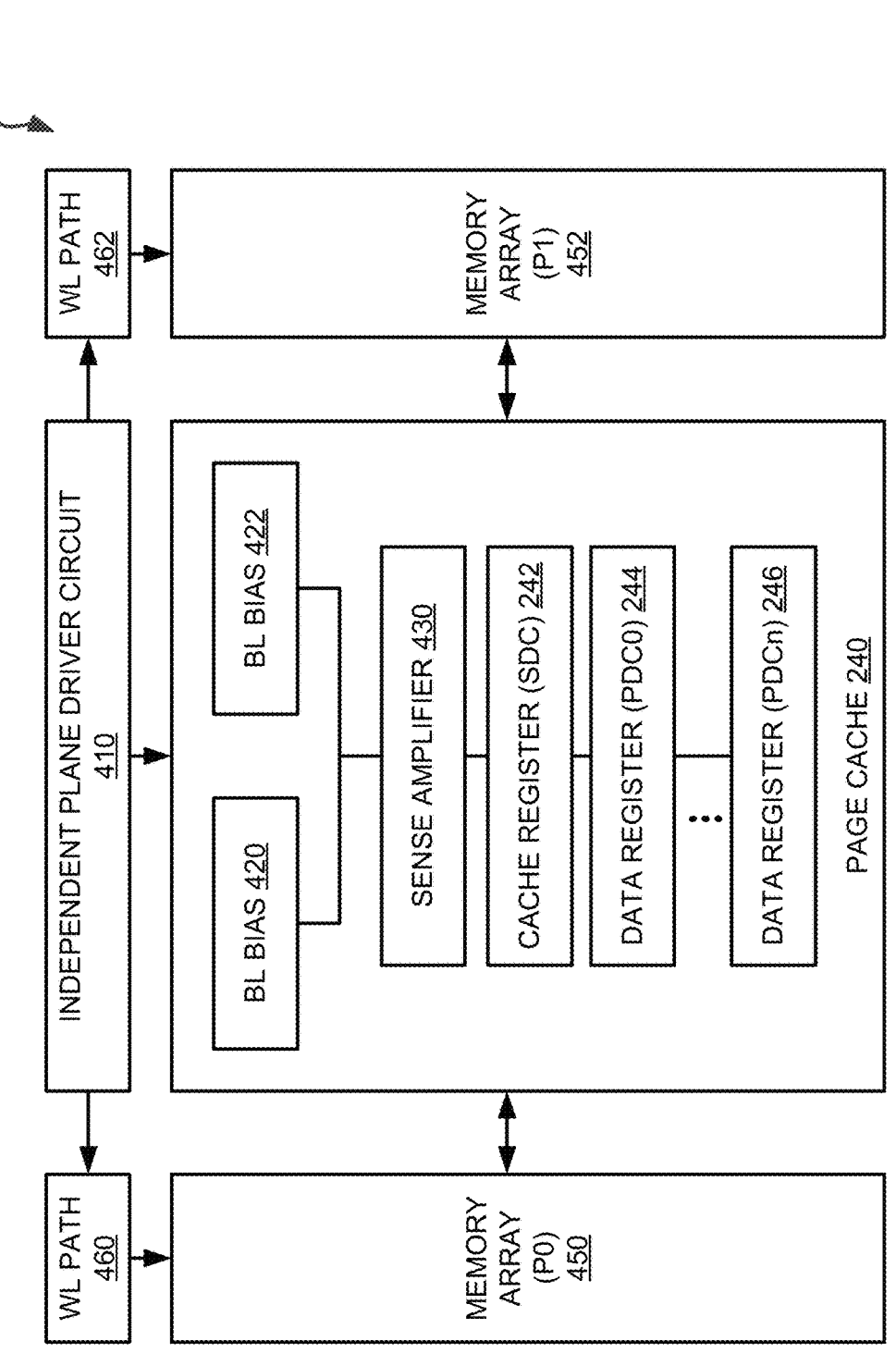
FIG. 4 is a block diagram illustrating concurrent page cache resource access in a multi-plane memory device in accordance with some embodiments of the present disclosure.

FIG. 4 is a block diagram illustrating concurrent page cache resource access in a multi-plane memory device 130 in accordance with some embodiments of the present disclosure. As illustrated, memory device 130 includes at least two separate memory arrays 450 and 452. In other embodiments, there can be any number of separate memory arrays. In one embodiment, memory arrays 450 and 452 can each be associated with separate planes (e.g., plane0 and plane1). In another embodiment, memory arrays 450 and 452 can each be separate memory arrays associated with a single plane. Each of memory arrays 450 and 452 can include an array of memory cells formed at the intersections of wordlines and bitlines. In one embodiment, the memory cells are grouped in to blocks, which can be further divided into sub-blocks, where a given wordline is shared across a number of sub-blocks, for example. In one embodiment, each sub-block corresponds to a separate plane in the memory array. The group of memory cells associated with a wordline within a sub-block is referred to as a physical page. Each physical page in one of the sub-blocks can include multiple page types. For example, a physical page formed from single level cells (SLCs) has a single page type referred to as a lower logical page (LP). Multi-level cell (MLC) physical page types can include LPs and upper logical pages (UPs), TLC physical page types are LPs, UPs, and extra logical pages (XPs), and QLC physical page types are LPs, UPs, XPs and top logical pages (TPs). For example, a physical page formed from memory cells of the QLC memory type can have a total of four logical pages, where each logical page can store data distinct from the data stored in the other logical pages associated with that physical page. Depending on the programming scheme used, each logical page of a memory cell can be programmed in a separate programming pass, or multiple logical pages can be programmed together. For example, in a QLC physical page, the LP can be programmed on one pass, and the UP, XP and TP can be programmed on a second pass. Other programming schemes are possible.

In one embodiment, each of memory arrays 450 and 452 has an associated respective wordline (WL) path 460 and 462. The respective wordline paths 460 and 462 can include associated signal drivers and other circuitry to interact with the wordlines of the associated memory arrays 450 and 452. In one embodiment, there is a shared independent plane driver circuit 410 and a shared page cache 240. Independent plane driver circuit 410 can include circuitry that performs concurrent memory page accesses on memory arrays of two or more memory planes, such as memory arrays 450 and 452. The page cache 240 is a buffer used to temporarily store data being read from or written to memory arrays 450 and 452, and can include concurrent bitline (BL) bias circuits 420 and 422, a shared sense amplifier 430, cache register 242 and one or more data registers 244-246. For a read operation, the data is read from memory array 450 or 452 into one of data registers 244-246, and then into cache register 242. Memory interface 113 can then read out the data from cache register 242. For a program operation, memory interface 113 writes the data to cache register 242, which is then passed to one of data registers 244-246, and finally programmed to one or both of memory arrays 450 or 452. For example, if the concurrent BL bias circuits 420 and 422 includes data storage elements (e.g., latches), the data from the shared data registers 244-246 can be temporarily held before being written to a respective one of memory array 450 or 452 to increase parallelism in the program operation. If the program operation includes multiple pages (e.g., UP, XP, and TP), each page can have a dedicated data register to hold the corresponding page data.

Figure 5:
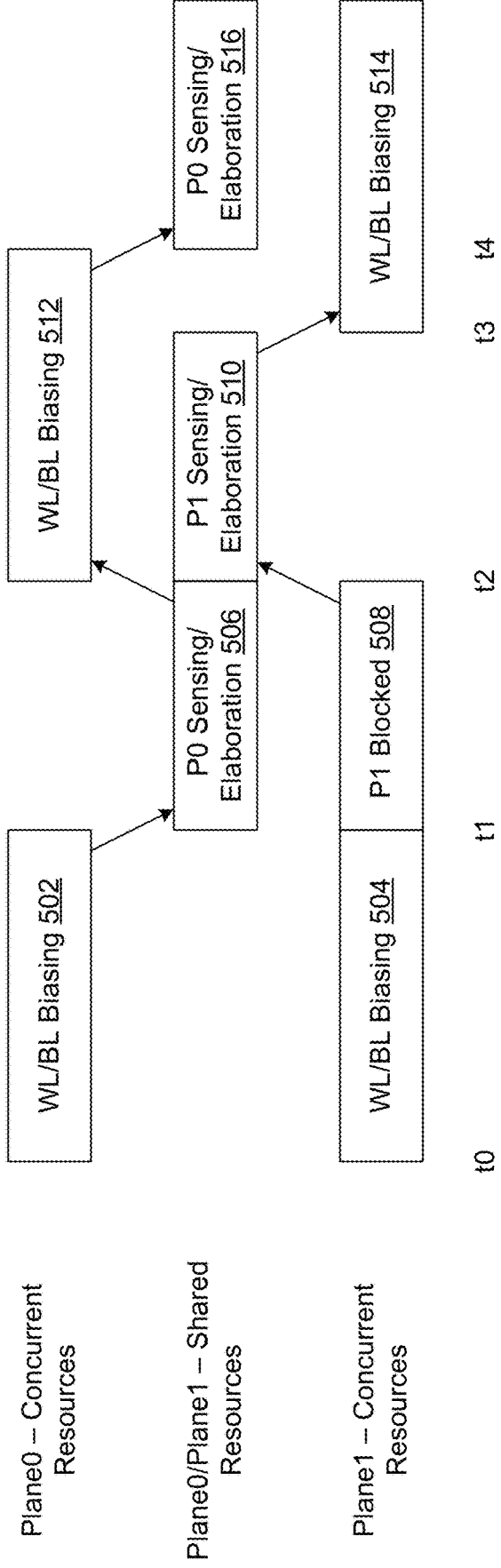
FIG. 5 is a timing diagram illustrating concurrent page cache resource access in a multi-plane memory device in accordance with some embodiments of the present disclosure.

Since in this embodiment, page cache 240 includes separate bitline bias circuits 420 and 422, the bitlines of respective memory arrays 450 and 452 can be biased concurrently. For example, as illustrated in FIG. 5, biasing operations 502 and 504 of the wordline and bitlines of two separate planes (e.g., plane0 and plane1) can be performed concurrently (i.e., at least partially overlapping in time) at time t0. In one embodiment, bitline bias circuit 420 can apply a voltage signal to one or more bitlines of memory array 450 while bitline bias circuit 422 can apply a voltage signal to one or more bitlines of memory array 452. Thus, different memory access operations (e.g., program operations, read operations) can be performed asynchronously on memory arrays 450 and 452. Accordingly, bitline bias circuits 420 and 422 can be considered as concurrent resources of page cache 240.

Since only a single instance of sense amplifier 430, cache register 242, and data registers 244-246 are present in page cache 240 in this embodiment, these can be considered as shared resources. Access to the shared resources can be provided on a time-multiplexed basis by control logic (e.g., independent plane driver circuit 410, local media controller 135) in the memory device 130. For example the control logic can implement a priority scheme pertaining to how access to the shared resources in page cache 240 is granted. In one embodiment, the access is granted on a first-come, first-served basis where access is granted in response to a first request, and subsequent requests are delayed until processing of the first request is complete. In another embodiment, the processing logic can implement some other protocol (e.g., based on priority levels of the associated memory array or of the type of request, based on a history of requests, etc.). For example, as illustrated in FIG. 5, once biasing operations 502 and 504 are complete, sensing and associated elaborations 506 for plane0 can be performed at time t1 using shared resources, such as amplifier 430, cache register 242, and data registers 244-246. During the time when sensing and associated elaborations 506 for plane0 are being performed, operations for plane1 are blocked 508, suspended, or otherwise delayed. Once sensing and associated elaborations 506 for plane0 are complete, sensing and associated elaborations 510 for plane1 can be performed at time t2 using the shared resources. At the same time t2, however, biasing operations 512 for plane0 can be performed by the concurrent resources (e.g., bitline bias circuit 420) for a subsequent operation. Once sensing and associated elaborations 510 are complete, at time t3 biasing operations 514 for plane1 can be performed by the concurrent resources (e.g., bitline bias circuit 422) for a subsequent operation. Once biasing operations 512 are complete, sensing and associated elaborations 516 for plane0 can be performed at time t4 using the shared resources, and so on.

Referring again to FIG. 4, the concurrent resources (e.g., bitline bias circuits 420 and 422) can operate asynchronously to perform associated operations on the respective memory arrays with which they are associated, while the shared resources (e.g., sense amplifier 430, cache register 242, and data registers 244-246) are time multiplexed with arbitration to perform associated operations. Performance benefits achieved using the design illustrated in FIG. 4 include, but are not limited to an increase in multi-plane read parallelism and general latency improvements attributable to the reduced bitline line length in memory arrays 450 and 452.

Figure 6:
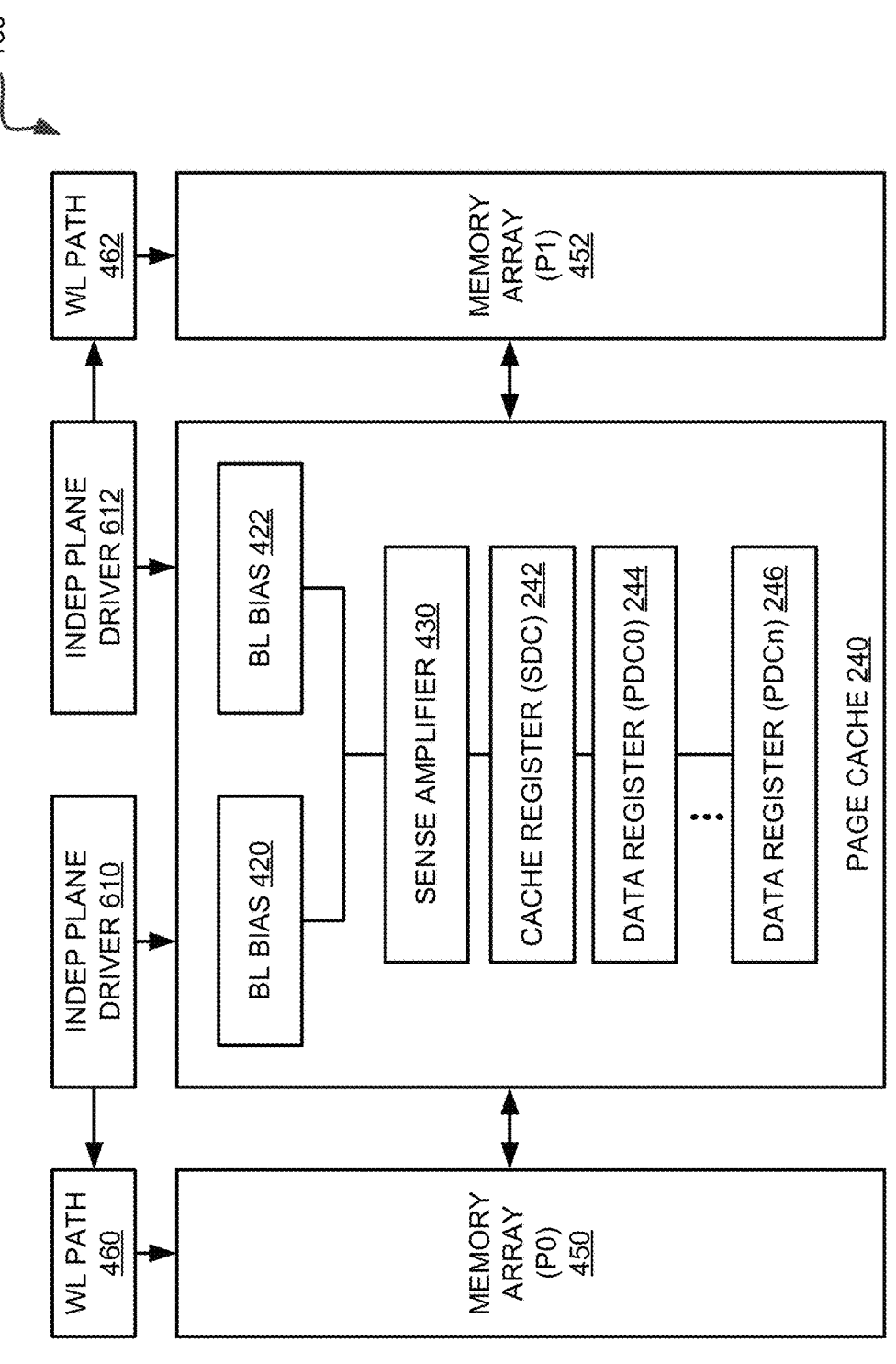
FIG. 6 is a block diagram illustrating concurrent page cache resource access in a multi-plane memory device in accordance with some embodiments of the present disclosure.

FIG. 6 is a block diagram illustrating concurrent page cache resource access in a multi-plane memory device 130 in accordance with some embodiments of the present disclosure. As illustrated and described above with respect to FIG. 4, memory device 130 includes at least two separate memory arrays 450 and 452. In other embodiments, there can be any number of separate memory arrays. In one embodiment, memory arrays 450 and 452 can each be associated with separate planes (e.g., plane0 and plane1), and can each have an associated respective wordline (WL) path 460 and 462. In one embodiment, there is a shared page cache 240, including concurrent bitline (BL) bias circuits 420 and 422, a shared sense amplifier 430, cache register 242 and one or more data registers 244-246. In this embodiment, however, rather than including a shared independent plane driver circuit, there is a separate independent plane driver circuit associated with each memory array 450 and 452. For example, independent plane driver circuit 610 is associated with memory array 450 and independent plane driver circuit 612 is associated with memory array 452. Each of independent plane driver circuits 610 and 612 can include circuitry that performs concurrent memory page accesses on the respective associated memory array. These concurrent resources (e.g., independent plane driver circuits 610 and 612, and bitline bias circuits 420 and 422) can operate asynchronously to perform associated operations on the respective memory arrays with which they are associated, while the shared resources (e.g., sense amplifier 430, cache register 242, and data registers 244-246) are time multiplexed with arbitration to perform associated operations. Performance benefits achieved using the design illustrated in FIG. 6 include, but are not limited to an increase in multi-plane read parallelism, asynchronous page access in each of memory arrays 450 and 452, and general latency improvements attributable to the reduced bitline line length in memory arrays 450 and 452.

Figure 7:
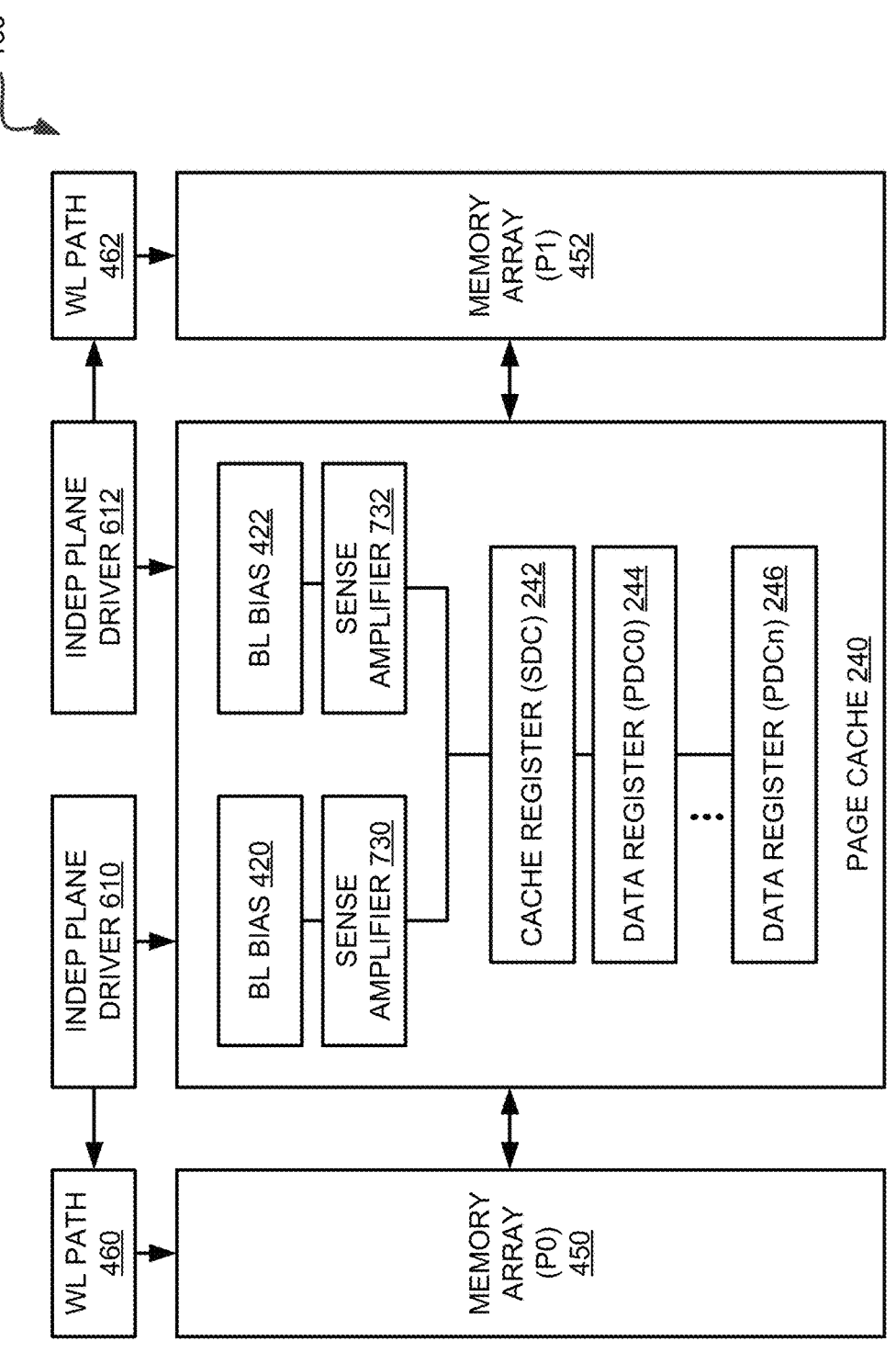
FIG. 7 is a block diagram illustrating concurrent page cache resource access in a multi-plane memory device in accordance with some embodiments of the present disclosure.

FIG. 7 is a block diagram illustrating concurrent page cache resource access in a multi-plane memory device 130 in accordance with some embodiments of the present disclosure. As illustrated and described above with respect to FIG. 4, memory device 130 includes at least two separate memory arrays 450 and 452. In other embodiments, there can be any number of separate memory arrays. In one embodiment, memory arrays 450 and 452 can each be associated with separate planes (e.g., plane0 and plane1), and can each have an associated respective wordline (WL) path 460 and 462 and independent plane driver circuit 610 and 612. In one embodiment, there is a shared page cache 240, including concurrent bitline (BL) bias circuits 420 and 422, concurrent sense amplifiers 730 and 732, and shared cache register 242 and one or more data registers 244-246. For example, sense amplifier 730 is associated with memory array 450 and sense amplifier 732 is associated with memory array 452. Concurrent sense amplifiers 730 and 732 can be used to perform asynchronous and concurrent sensing operations on the respective memory arrays. To store any sensed data, however, still involves time-multiplexed sharing of cache register 242 and data registers 244-246. Performance benefits achieved using the design illustrated in FIG. 7 include, but are not limited to an increase in multi-plane read parallelism, an increase in multi-plane program parallelism for SLC program operations, asynchronous page access in each of memory arrays 450 and 452, and general latency improvements attributable to the reduced bitline line length in memory arrays 450 and 452.

Figure 8:
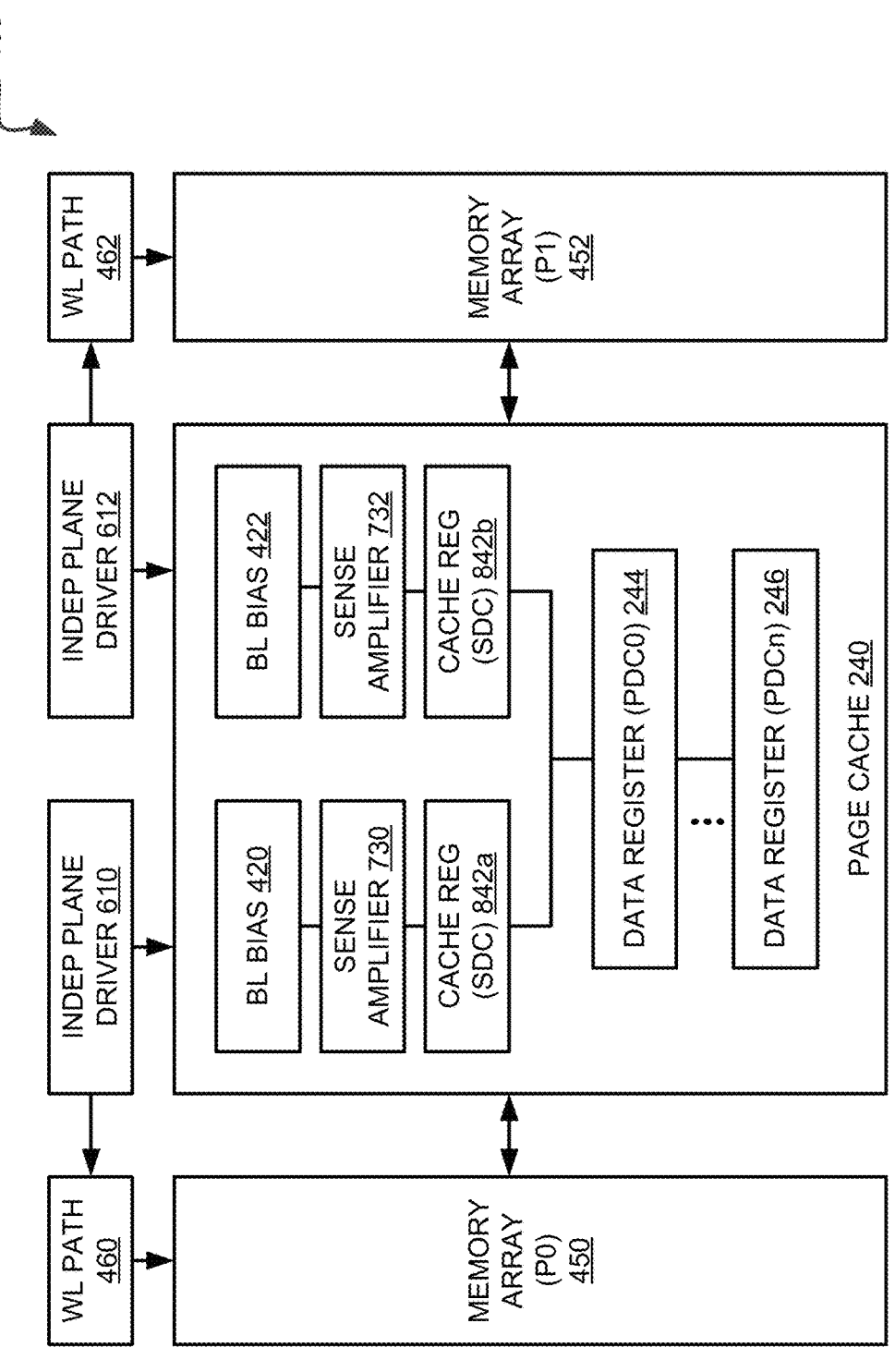
FIG. 8 is a block diagram illustrating concurrent page cache resource access in a multi-plane memory device in accordance with some embodiments of the present disclosure.

FIG. 8 is a block diagram illustrating concurrent page cache resource access in a multi-plane memory device 130 in accordance with some embodiments of the present disclosure. As illustrated and described above with respect to FIG. 4, memory device 130 includes at least two separate memory arrays 450 and 452. In other embodiments, there can be any number of separate memory arrays. In one embodiment, memory arrays 450 and 452 can each be associated with separate planes (e.g., plane0 and plane1), and can each have an associated respective wordline (WL) path 460 and 462 and independent plane driver circuit 610 and 612. In one embodiment, there is a shared page cache 240, including concurrent bitline (BL) bias circuits 420 and 422, concurrent sense amplifiers 730 and 732, concurrent cache registers 842*a* and 842*b*, and one or more shared data registers 244-246. For example, cache registers 842*a* is associated with memory array 450 and cache registers 842*b* is associated with memory array 452. Concurrent cache registers 842*a* and 842*b* can be used to perform asynchronous and concurrent storage operations on the respective memory arrays. For example, any read operations or SLC program operations can be performed fully asynchronously and concurrently on memory arrays 450 and 452, since such operations utilize only a single latch or other data storage element in page cache 240. Performance benefits achieved using the design illustrated in FIG. 8 include, but are not limited to an increase in multi-plane read parallelism, an increase in multi-plane program parallelism for SLC program operations, asynchronous page access in each of memory arrays 450 and 452, and general latency improvements attributable to the reduced bitline line length in memory arrays 450 and 452.

Figure 9:
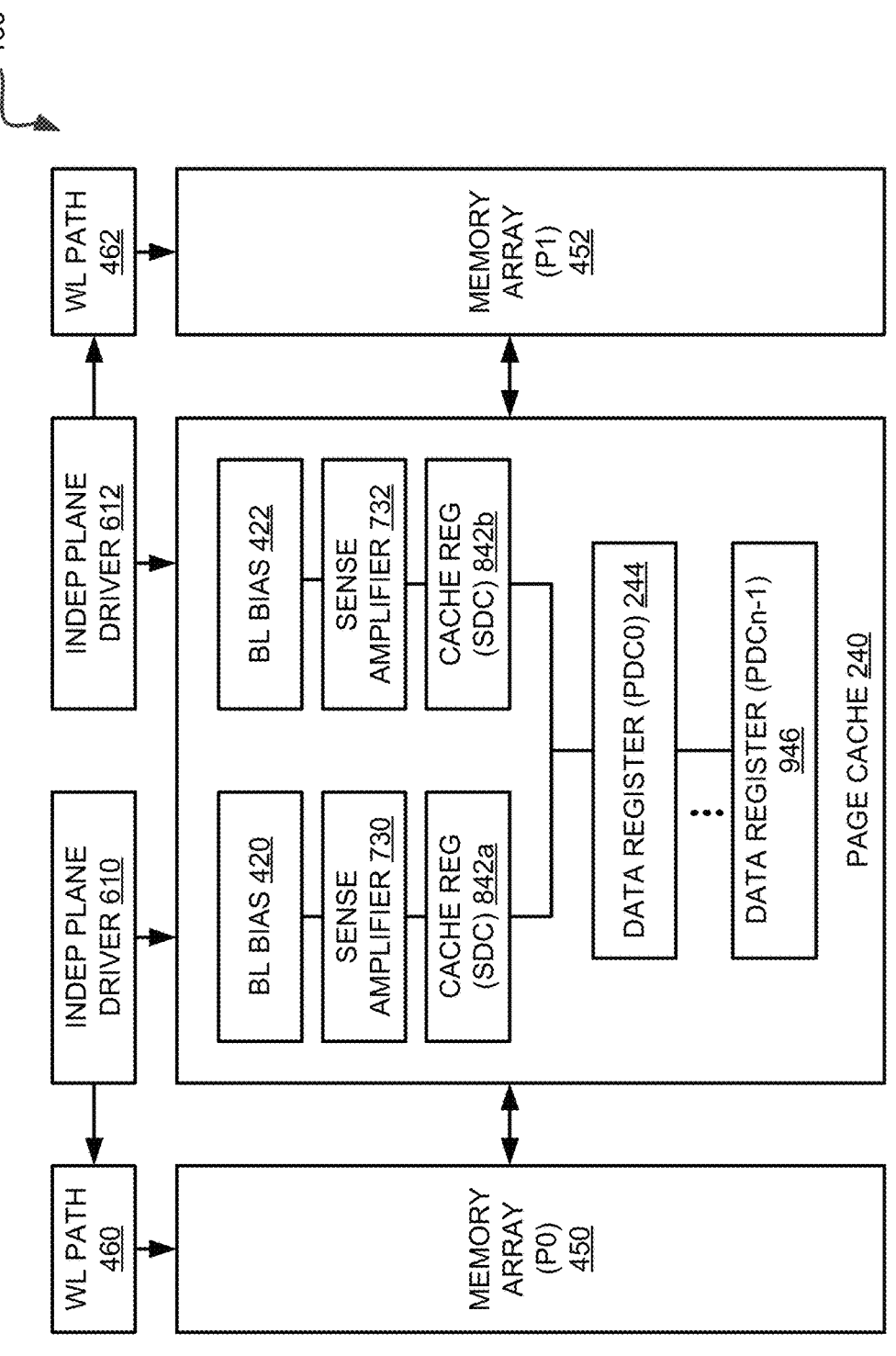
FIG. 9 is a block diagram illustrating concurrent page cache resource access in a multi-plane memory device in accordance with some embodiments of the present disclosure.

FIG. 9 is a block diagram illustrating concurrent page cache resource access in a multi-plane memory device 130 in accordance with some embodiments of the present disclosure. As illustrated and described above with respect to FIG. 4, memory device 130 includes at least two separate memory arrays 450 and 452. In other embodiments, there can be any number of separate memory arrays. In one embodiment, memory arrays 450 and 452 can each be associated with separate planes (e.g., plane0 and plane1), and can each have an associated respective wordline (WL) path 460 and 462 and independent plane driver circuit 610 and 612. In one embodiment, there is a shared page cache 240, including concurrent bitline (BL) bias circuits 420 and 422, concurrent sense amplifiers 730 and 732, concurrent cache registers 842*a* and 842*b*, and one or more shared data registers 244-946. In this embodiment, there can be one less data register (i.e., PDCn−1) than in the embodiment illustrated in FIG. 8 (which includes PDCn). Since a fixed maximum total number of latches is required in page cache 240, the addition of an extra cache register (e.g., concurrent cache register 842*b*) means that one data register can optionally be removed. This removal saves area in the page cache 240, reducing cost and complexity.

FIG. 10 is a flow diagram of an example method of providing concurrent page cache resource access in a multi-plane memory device in accordance with some embodiments of the present disclosure. The method 1000 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1000 is performed by page cache 240 of concurrent page buffer (PB) resources access circuitry 150. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 1005, requests are received. For example, memory device 130 can receive one or more memory access commands/requests to perform corresponding memory access operations. In one embodiment, memory device 130 receives a first request to perform a first memory access operation on a first memory array, such as memory array 450, and a second request to perform a second memory access operation on a second memory array, such as memory array 452. The requests can include respective address identifying the corresponding memory arrays. Depending on the embodiment, the memory access operations can include read operations, program operations, erase operations, or some other type of operations. In one embodiment, the requests are received from a requestor, such as memory interface 113 of memory sub-system controller 115 or host system 120.

At operation 1010, requests are processed. For example, the memory device 130 can perform the first and second memory access operations. In one embodiment, the memory device 130 performs a first portion of the first memory access operation and a first portion of the second memory access operation concurrently using a set of concurrent resources of a page cache circuit, such as page cache 240, coupled to the first memory array and the second memory array. As described above, the concurrent resources of page cache 240 can vary depending on the specific implementation. For example, the concurrent resources can include a first bitline bias circuit 420 associated with the first memory array 450 and a second bitline bias circuit 422 associated with the second memory array 452. In such an embodiment, performing the first portion of the first memory access operation and the first portion of the second memory access operation concurrently comprises causing a bias voltage to be applied to respective bitlines of the first memory array 450 and the second memory array 452 using the first bitline bias circuit 420 and the second bitline bias circuit 422. In other embodiments, where page cache 240 includes other concurrent resources, the first portions of the first and second memory access operations can include other operations and/or processes.

At operation 1015, a selection is made. For example, the memory device 130 can select a second portion of one of the first or second memory access operations to perform using at least one shared resource of page cache 240 using an arbitration scheme. Depending on the embodiment, the arbitration scheme can include allocating the at least one shared resource based on a request to perform a memory access operation received first in time, or based on priority levels associated with the first and second memory access operations. For example, certain types of memory access operations (e.g., read operations) can have a higher priority that other types (e.g., program operations), or a memory access operation directed to a memory array on which an operation was most recently performed can have a lower priority than a memory access operation directed to another memory array.

At operation 1020, an operation is performed. For example, page cache 240 can perform a second portion of the first memory access operation using a shared resource. As described above, the shared resources of page cache 240 can vary depending on the specific implementation. For example, the shared resources can include sense amplifier 430, cache register 242, and one or more data registers 244-246. In such an embodiment, performing the second portion of the first memory access operation comprises sensing a voltage from a corresponding wordline of the first memory array 450 using the sense amplifier 430 and storing a corresponding value in at least one of the cache register 242 or the one or more data registers 244-246. In other embodiments, where page cache 240 includes other shared resources, the second portion of the first memory access operation can include other operations and/or processes.

At operation 1025, an operation is performed. For example, upon completion of the second portion of the first memory access operation, page cache 240 can perform a second portion of the second memory access operation using the at least one shared resource. Thus, the shared resources of page cache 240 are configured to perform the second portions of the first and second memory access operations successively in time.

Figure 11:
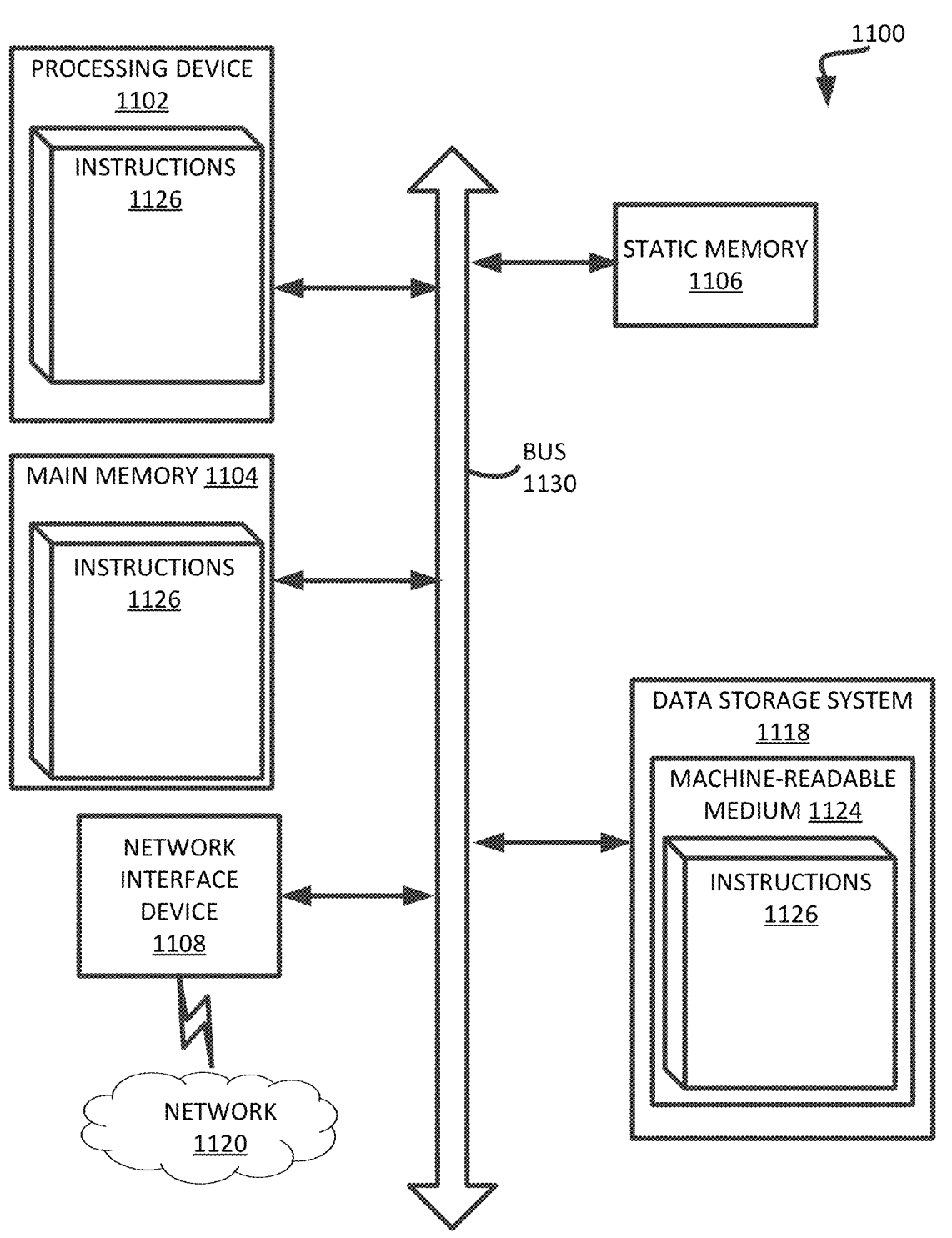
FIG. 11 is a block diagram of an example computer system in which embodiments of the present disclosure can operate.

FIG. 11 illustrates an example machine of a computer system 1100 within which a set of instructions, for causing the machine to perform any one or more of the methodologies discussed herein, can be executed. In some embodiments, the computer system 1100 can correspond to a host system (e.g., the host system 120 of FIG. 1) that includes, is coupled to, or utilizes a memory sub-system (e.g., the memory sub-system 110 of FIG. 1) or can be used to perform the operations of a controller. In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1100 includes a processing device 1102, a main memory 1104 (e.g., read-only memory (ROM), flash memory, dynamic random access memory (DRAM) such as synchronous DRAM (SDRAM) or Rambus DRAM (RDRAM), etc.), a static memory 1106 (e.g., flash memory, static random access memory (SRAM), etc.), and a data storage system 1118, which communicate with each other via a bus 1130.

Processing device 1102 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1102 can also be one or more special-purpose processing devices such as an application specific integrated circuit (ASIC), a field programmable gate array (FPGA), a digital signal processor (DSP), network processor, or the like. The processing device 1102 is configured to execute instructions 1126 for performing the operations and steps discussed herein. The computer system 1100 can further include a network interface device 1108 to communicate over the network 1120.

The data storage system 1118 can include a machine-readable storage medium 1124 (also known as a computer-readable medium, such as a non-transitory computer-readable medium) on which is stored one or more sets of instructions 1126 or software embodying any one or more of the methodologies or functions described herein. The instructions 1126 can also reside, completely or at least partially, within the main memory 1104 and/or within the processing device 1102 during execution thereof by the computer system 1100, the main memory 1104 and the processing device 1102 also constituting machine-readable storage media. The machine-readable storage medium 1124, data storage system 1118, and/or main memory 1104 can correspond to the memory sub-system 110 of FIG. 1.

While the machine-readable storage medium 1124 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
a first memory array;
a second memory array; and
a page cache circuit disposed within the memory device and comprising bitline bias circuitry, at least one sense amplifier, and a plurality of registers, wherein the page cache circuit is directly coupled to the first memory array and the second memory array to temporarily store data being read from or written to the first memory array and the second memory array, wherein the page cache circuit comprises at least one set of concurrent resources and at least one shared resource, wherein the at least one set of concurrent resources are concurrently accessible by the first memory array and the second memory array to perform either a same type or different types of memory access operations respectively, wherein the at least one shared resource comprises a cache register and one or more data registers disposed within the page cache circuit, and wherein the cache register and the one or more data registers are accessible in a time-multiplexed fashion by the first memory array and the second memory array such that the cache register and the one or more data registers perform operations on the first memory array and the second memory array successively in time.

2. The memory device of claim 1, wherein the at least one set of concurrent resources comprises a first bitline bias circuit associated with the first memory array and a second bitline bias circuit associated with the second memory array.

3. The memory device of claim 2, wherein the at least one shared resource comprises the at least one sense amplifier, the cache register, and the one or more data registers.

4. The memory device of claim 1, wherein the at least one set of concurrent resources comprises a first sense amplifier associated with the first memory array and a second sense amplifier associated with the second memory array.

5. The memory device of claim 1, wherein the first memory array and the second memory array are disposed on a single memory plane of the memory device.

6. The memory device of claim 1, wherein the first memory array and the second memory array are disposed on separate memory planes of the memory device.

7. A method comprising:
receiving, at a memory device, requests to perform respective memory access operations on a first memory array and a second memory array of the memory device;
performing at least a portion of the respective memory access operations concurrently using a set of concurrent resources of a page cache circuit disposed within the memory device and directly coupled to the first memory array and the second memory array, wherein the page cache circuit temporarily stores data being read from or written to the first memory array and the second memory array; and
performing at least a portion of the respective memory access operations in a time-multiplexed fashion using at least one shared resource of the page cache circuit, wherein the at least one shared resource comprises a cache register and one or more data registers disposed within the page cache circuit, and wherein performing at least the portion of the respective memory access operations in the time-multiplexed fashion comprises performing operations on the first memory array and the second memory array successively in time using the cache register and the one or more data registers.

8. The method of claim 7, wherein the at least one set of concurrent resources comprises a first bitline bias circuit associated with the first memory array and a second bitline bias circuit associated with the second memory array, and wherein performing at least the portion of the respective memory access operations concurrently comprises causing a bias voltage to be applied to respective bitlines of the first memory array and the second memory array using the first bitline bias circuit and the second bitline bias circuit.

9. The method of claim 8, wherein the at least one shared resource comprises a sense amplifier, the cache register, and the one or more data registers, and wherein performing at least the portion of the respective memory access operations in the time-multiplexed fashion comprises sensing a voltage from a corresponding wordline of the first memory array using the sense amplifier and storing a corresponding value in at least one of the cache register or the one or more data registers.

10. The method of claim 7, wherein the at least one set of concurrent resources comprises a first bitline bias circuit associated with the first memory array and a second bitline bias circuit associated with the second memory array.

11. The method of claim 7, wherein the at least one set of concurrent resources comprises a first sense amplifier associated with the first memory array and a second sense amplifier associated with the second memory array.

12. The method of claim 7, further comprising:
selecting at least the portion of the respective memory access operations to perform in the time-multiplexed fashion using an arbitration scheme.

13. The method of claim 12, wherein the arbitration scheme comprises allocating the at least one shared resource based on a request to perform a memory access operation received first in time.

14. The method of claim 12, wherein the arbitration scheme comprises allocating the at least one shared resource based on priority levels associated with the first and second memory access operations.

15. A memory device comprising:

a plurality of memory arrays; and a page cache circuit disposed within the memory device and comprising bitline bias circuitry, at least one sense amplifier, and a plurality of registers, wherein the page cache circuit is directly coupled to the plurality of memory arrays to temporarily store data being read from or written to the plurality of memory arrays, wherein the page cache circuit comprises at least one set of concurrent resources configured to perform operations on the plurality of memory arrays concurrently, and at least one shared resource configured to perform operations on the plurality of memory arrays successively in time, the at least one shared resource comprising a cache register and one or more data registers disposed within the page cache circuit, wherein the cache register and the one or more data registers are accessible in a time-multiplexed fashion by the plurality of memory arrays such that the cache register and the one or more data registers perform operations on the plurality of memory arrays successively in time.

16. The memory device of claim 15, wherein the page cache circuit is configured to select an order of the operations to be performed successively by the at least one shared resource according to an associated arbitration scheme.

17. The memory device of claim 16, wherein the arbitration scheme comprises allocating the at least one shared resource based on a request to perform a memory access operation received first in time.

18. The memory device of claim 16, wherein the arbitration scheme comprises allocating the at least one shared resource based on priority levels associated with the operations.

19. The memory device of claim 15, wherein the plurality of memory arrays are disposed on a single memory plane of the memory device.

20. The memory device of claim 15, wherein the plurality of memory arrays are disposed separate memory planes of the memory device.

\* \* \* \* \*